United States Patent
Nuebling et al.

(10) Patent No.: US 12,282,045 B2
(45) Date of Patent: Apr. 22, 2025

(54) COMMON MODE EVALUATION IN A DIFFERENTIAL GALVANIC ISOLATION SIGNAL TRANSMISSION CIRCUIT

(71) Applicant: Infineon Technologies AG, Neubiberg (DE)

(72) Inventors: Marcus Nuebling, Olching-Esting (DE); Tommaso Bacigalupo, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 181 days.

(21) Appl. No.: 18/061,001

(22) Filed: Dec. 2, 2022

(65) Prior Publication Data

US 2024/0183883 A1 Jun. 6, 2024

(51) Int. Cl.
*G01R 15/18* (2006.01)
*G01R 27/28* (2006.01)

(52) U.S. Cl.
CPC ........... *G01R 15/181* (2013.01); *G01R 27/28* (2013.01)

(58) Field of Classification Search
CPC .............................. G01R 15/181; G01R 27/28
USPC ....... 324/500, 537, 329–348, 323, 447, 425, 324/600, 618, 637, 639, 658, 750.12, 7, 324/6.11, 763.01
See application file for complete search history.

(56) References Cited

U.S. PATENT DOCUMENTS

| | | | |
|---|---|---|---|
| 3,705,365 A | 12/1972 | Szabo et al. | |
| 4,580,112 A | 4/1986 | Winslow | |
| 4,679,130 A | 7/1987 | Moscovici | G05F 1/563 |
| 4,725,938 A | 2/1988 | Onodera | H02M 3/135 |
| 4,876,637 A | 10/1989 | Mose | H02M 3/135 |
| 4,937,720 A | 6/1990 | Kirchberg | H02M 5/272 |
| 5,373,223 A | 12/1994 | Akagi | |
| 5,483,140 A | 1/1996 | Hess | |
| 5,568,371 A | 10/1996 | Pitel | H02J 3/01 |
| 5,661,390 A | 8/1997 | Lipo | H02M 1/12 |
| 5,831,842 A | 11/1998 | Ogasawara et al. | |
| 6,134,126 A | 10/2000 | Ikekame | H02M 3/01 |
| 6,208,537 B1 | 3/2001 | Skibinski | H02M 1/12 |

(Continued)

OTHER PUBLICATIONS

"IGBT reverse conduction characteristics Hard-switching and soft-switching," Energy Saving Products BU, International Rectifier, Jul. 2013, 7 pp.

(Continued)

*Primary Examiner* — Raul J Rios Russo
*Assistant Examiner* — Trung Q Nguyen
(74) *Attorney, Agent, or Firm* — Shumaker & Sieffert, P.A.

(57) ABSTRACT

Circuits, devices and systems that include a low voltage test for common mode transient immunity (CMTI). The CMTI test of this disclosure may be used in a variety of applications, such as a data transmission circuit configured to communicate across galvanic isolation. A differential circuit may include two signal paths. For robust common mode transient rejection, the first signal path should be the same as the second signal path. Differences in the resistance, inductance, and capacitance between the two signal paths may result in common mode noise being measured as a differential signal at the output terminals. Devices according to the techniques of this disclosure are configured to enter a test mode to conduct a low voltage test that outputs a measurement of CMTI at any phase of production or field use.

19 Claims, 7 Drawing Sheets

(56) References Cited

U.S. PATENT DOCUMENTS

| | | | |
|---|---|---|---|
| 6,377,479 B1 | 4/2002 | Ayano | H02M 1/12 |
| 6,452,819 B1 | 9/2002 | Wobben | H02M 1/126 |
| 6,636,107 B2 | 10/2003 | Pelly | H02M 1/12 |
| 6,646,837 B2 | 11/2003 | West | H02M 1/15 |
| 6,690,230 B2 | 2/2004 | Pelly | H02M 1/12 |
| 6,775,157 B2 | 8/2004 | Honda | H02M 1/12 |
| 6,781,444 B2 | 8/2004 | Pelly | H02M 1/15 |
| 6,788,558 B2 | 9/2004 | Pelly | H02M 1/126 |
| 6,794,929 B2 | 9/2004 | Pelly | H02M 1/12 |
| 6,819,076 B2 | 11/2004 | Takahashi | |
| 6,839,250 B2 | 1/2005 | Takahashi | H02M 1/15 |
| 6,842,069 B2 | 1/2005 | Takahashi | H02M 1/12 |
| 6,898,092 B2 | 5/2005 | Briere | H02M 1/44 |
| 6,911,805 B2 | 6/2005 | Salama | |
| 6,954,366 B2 | 10/2005 | Lai | H02M 5/293 |
| 6,985,341 B2 | 1/2006 | Vinciarelli | H02M 1/32 |
| 7,050,311 B2 | 5/2006 | Lai | H02M 5/225 |
| 7,084,604 B2 | 8/2006 | Salomaki | H02P 21/13 |
| 7,187,229 B2 | 3/2007 | Pelly | H02M 1/12 |
| 7,215,559 B2 | 5/2007 | Nondahl | |
| 7,256,662 B2 | 8/2007 | Wasaki | |
| 7,315,592 B2 | 1/2008 | Tsatsanis et al. | |
| 7,372,914 B2 * | 5/2008 | Calvin | H04L 25/4902 375/272 |
| 7,385,438 B2 | 6/2008 | Pelly | H02M 1/12 |
| 7,423,520 B2 | 9/2008 | Wasaki | H03H 7/09 |
| 7,443,229 B1 | 10/2008 | Vinciarelli | H02M 1/32 |
| 7,483,796 B2 | 1/2009 | Mclaughlin | G01R 31/006 |
| 7,532,072 B1 | 5/2009 | Tavakoli Dastjerdi et al. | |
| 7,532,491 B2 | 5/2009 | Lim | |
| 7,545,114 B2 | 6/2009 | Baudesson | H02M 1/12 |
| 7,548,439 B2 | 6/2009 | Meguro | H02M 1/12 |
| 7,583,136 B2 | 9/2009 | Pelly | H02M 1/12 |
| 7,606,052 B2 | 10/2009 | Akagi | H02M 1/12 |
| 7,724,043 B1 | 5/2010 | LeBoeuf et al. | |
| 7,881,081 B1 | 2/2011 | Tallam | H02M 1/44 |
| 7,944,273 B1 | 5/2011 | Vinciarelli | H02M 1/32 |
| 8,023,245 B2 | 9/2011 | Feng | H02K 11/02 |
| 8,164,292 B2 | 4/2012 | Park | H02P 23/26 |
| 8,169,179 B2 | 5/2012 | Mohan | H02M 5/271 |
| 8,299,837 B1 | 10/2012 | Lin | |
| 8,319,462 B2 | 11/2012 | Inuduka | H02M 1/126 |
| 8,362,733 B2 | 1/2013 | Inuduka | H02M 1/126 |
| 8,400,792 B2 | 3/2013 | Sato | |
| 8,472,215 B2 | 6/2013 | Koyama | H02M 1/126 |
| 8,514,596 B2 | 8/2013 | Koyama | H02M 1/12 |
| 8,570,773 B2 | 10/2013 | Skibinski | |
| 8,587,248 B2 | 11/2013 | Hiller | |
| 8,649,193 B2 | 2/2014 | Sakai | H02M 1/15 |
| 8,724,678 B2 | 5/2014 | Farjadrad | |
| 8,755,205 B2 | 6/2014 | Azuma | |
| 8,879,645 B2 | 11/2014 | Okabe | |
| 8,891,595 B1 | 11/2014 | Farjadrad | |
| 8,970,148 B2 | 3/2015 | Vrankovic | H02P 27/06 |
| 9,048,817 B2 | 6/2015 | Shen | H03H 11/1217 |
| 9,054,770 B2 | 6/2015 | Okabe | |
| 9,130,542 B1 | 9/2015 | Ishihara | H03H 11/126 |
| 9,264,083 B2 | 2/2016 | Okabe | |
| 9,397,645 B2 | 7/2016 | Bernacchia et al. | |
| 9,621,094 B2 | 4/2017 | Vrankovic | |
| 9,653,919 B2 | 5/2017 | Oswald | |
| 9,800,133 B2 | 10/2017 | Klotz et al. | |
| 2002/0011900 A1 | 1/2002 | Baschirotto et al. | |
| 2003/0001674 A1 | 1/2003 | Nagaraj | |
| 2007/0115030 A1 | 5/2007 | Bhattacharya et al. | |
| 2012/0154048 A1 | 6/2012 | Myles | |
| 2015/0280696 A1 | 10/2015 | Bernacchia et al. | |
| 2021/0036896 A1 * | 2/2021 | Petrie | H02M 3/06 |
| 2021/0119590 A1 * | 4/2021 | Du | H03F 3/245 |
| 2022/0103197 A1 * | 3/2022 | Briseno-Vidrios | H04B 1/1027 |
| 2023/0006559 A1 * | 1/2023 | Bertoni | H02M 3/33569 |

OTHER PUBLICATIONS

"ISO72x Single Channel High-Speed Digital Isolators", Texas Instruments, Jan. 2006, 36 pp.

"Peak Detector"; Basic Electronics Tutorials; Retrieved from: https://www.electronics-tutorial.net/analog-integrated-circuits/peak-detector/; Accessed on Oct. 12, 2022; 3 pp.

"Power Supply Design Notes: hard switching and Soft switching to reduce losses", Power Electronic News, Dec. 13, 2020, 6 pp.

"Understanding Common Mode Noise"; Pulse a Yageo Company; Retrieved from https://www.pulseelectronics.com/wp-content/uploads/2021/01/Pulse-Power-BU-Understanding-Common-Mode-Noise.pdf; Accessed on Oct. 12, 2022; 6 pp.

"Understanding Common-Mode Signals"; Maxim Integrated; Retrieved from https://www.maximintegrated.com/en/design/technical-documents/tutorials/2/2045.html.; Accessed on Oct. 12, 2022; 6 pp.

"ADuM1100"; Data Sheet, Analog Devices Inc.; Retrieved from: https://www.analog.com/media/en/technical-documentation/data-sheets/adum1100.pdf; Accessed on Oct. 12, 2022; 20 pp.

Gingerich, "ISO72x Digital Isolator Magnetic-Field Immunity", Texas Instruments, Jan. 2006, 7 pp.

Infineon, "EiceDRIVER™ 1EDBx275F", Infineon Technologies AG, Nov. 8, 2021, 33 pp., Retrieved from the Internet on Nov. 23, 2022 from URL: https://www.infineon.com/dgdl/Infineon-1EDB8275F-DataSheet-v02_02-EN.pdf?fileId=8ac78c8c7d0d8da4017d2c9fcldd6c0b.

Infineon, "EiceDRIVER™ SENSE", Infineon Technologies AG, Dec. 9, 2021, 126 pp., Retrieved from the Internet on Nov. 23, 2022 from URL: https://www.infineon.com/dgdl/Infineon-1EDI2010AS-DataSheet-v02_10-EN.pdf?fileId=5546d4625d5945ed015d5af92cfc0451.

Infineon, "EiceDRIVERTM SIL", Infineon Technologies AG, Jan. 10, 2022, 138 pp., Retrieved from the Internet on Nov. 23, 2022 from URL: https://www.infineon.com/dgdl/Infineon-1EDI2004AS-DataSheet-v02_20-EN.pdf?fileId=5546d4626clf3dc3016c84fc5c3b7daf.

Infineon, "Gate Driver ICs", 2022, 40 pp., Retrieved from the Internet on Nov. 23, 2022 from URL: https://www.infineon.com/cms/en/product/power/gate-driver-ics/.

Kaeriyama et al., "A 2.5 kV Isolation 35 kV/us CMR 250 Mbps Digital Isolator in Standard CMOS With a Small Transformer Driving Technique", IEEE journal of solid-state circuits, vol. 47, No. 2, Feb. 2012, pp. 435-443.

Neugebauer et al., "Parasitic Capacitance Cancellation in Filter Inductors," IEEE Transactions on Power Electronics, vol. 21, No. 1, Jan. 2007, pp. 282-288.

Ogasawara et al., "An Active Circuit for Cancellation of Common-Mode Voltage Generated by a PWM Inverter," IEEE Transactions on Power Electronics, vol. 13, No. 5, Sep. 1998, pp. 835-841.

U.S. Appl. No. 18/046,396, filed Oct. 13, 2022, naming inventors Barrenscheen et al.

Yun et al., "A Transformer-based Digital Isolator With 20kVPK Surge Capability and > 200kV/μS Common Mode Transient Immunity", IEEE Symposium on VLSI Circuits, Jun. 15, 2016, 2 pp.

* cited by examiner

COMMON MODE EVALUATION IN A DIFFERENTIAL GALVANIC ISOLATION SIGNAL TRANSMISSION CIRCUIT

TECHNICAL FIELD

The disclosure relates to circuits that include isolated differential-signal transmission.

BACKGROUND

Some circuits may include an isolation barrier between different circuitry such as, for example, digital circuitry and high voltage circuitry. In some examples, the isolation barrier may be a galvanic isolation barrier. Some examples of circuits with an isolation barrier may include power switch driver circuits, coupler circuits, circuits that operate in different voltage domains, and other types of circuits. In some examples, such circuits may include isolated differential-signal transmission circuitry or other elements for communication of commands, data, status, alerts, and similar messages across the isolation barrier.

SUMMARY

In general, the disclosure describes circuits, devices and systems that include a low voltage test for common mode transient immunity (CMTI). The CMTI test of this disclosure may be used in a variety of applications, such as a data transmission circuit configured to communicate across galvanic isolation. A differential circuit, such as for data transmission, may include two input terminals and two output terminals. A differential signal at the two input terminals may be received and interpreted at the two output terminals using a variety of data transmission schemes. For robust common mode transient rejection, the first signal path from the first input terminal to the first output terminal should be the same as the second signal path from the second input terminal to the second output terminal. Differences in the resistance, inductance, and capacitance between the two signal paths may result in common mode noise being measured as a differential signal at the output terminals.

Other examples of tests to determine common mode transient immunity may be executed only during the design phase of a product. In contrast, devices according to the techniques of this disclosure may be configured to enter a test mode to conduct a low voltage test that outputs a measurement of CMTI at any phase of production or field use.

In one example, this disclosure describes a circuit comprising a galvanic isolation barrier comprising one or more coupling components configured to conduct signals across the galvanic isolation barrier; isolated differential-signal communication circuitry comprising the coupling components; test mode circuitry configured to determine an indication of common mode transient immunity (CMTI) for the isolated differential-signal communication circuitry.

In another example, this disclosure describes a system comprising a controller including processing circuitry; a circuit comprising a galvanic isolation barrier comprising one or more coupling components configured to conduct signals across the galvanic isolation barrier; isolated differential-signal communication circuitry comprising the coupling components; and test mode circuitry configured to determine an indication of CMTI for the isolated differential-signal communication circuitry.

In another example, this disclosure describes a method comprising: receiving, by a circuit comprising a first signal path and a second signal path, receiving, by a circuit comprising a galvanic isolation barrier, a signal at a first time to be conducted across the galvanic isolation barrier; conducting, by isolated differential-signal transmission circuitry of the circuit, the signal across the galvanic isolation barrier at the first time, wherein the isolated differential-signal transmission circuitry comprises: a first signal path and a second signal path, and a receiver; comparing, by the receiver, the signal from the first signal path and the second signal path; and outputting, by the receiver, an indication of a difference between the first signal path and the second signal path; applying, by test mode circuitry of the circuit, a common mode test signal to both the first signal path and the second signal path at a second time different from the first time; comparing, by the receiver, the common mode test signal from the first signal path and the second signal path at the second time; determining an indication of CMTI for the isolated differential-signal transmission circuitry at the second time, based on the comparison.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
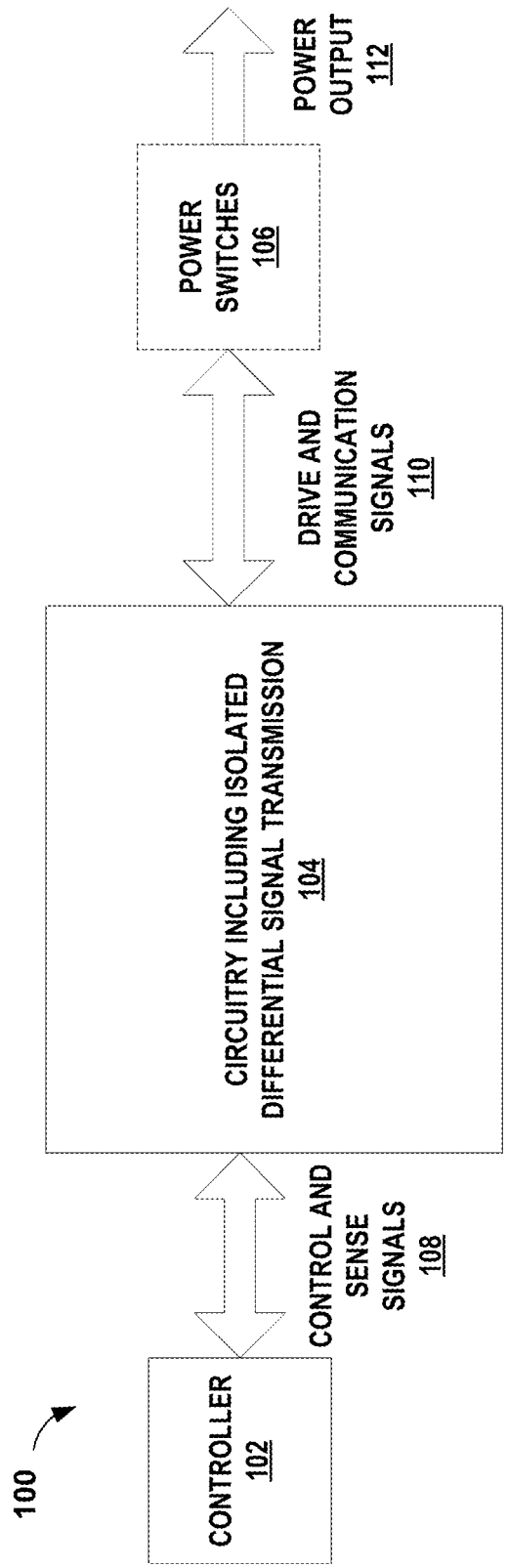
FIG. 1 is a block diagram illustrating an example system that includes circuitry with isolated differential-signal transmission, according to one or more techniques of this disclosure.

The disclosure describes circuits, devices and systems that include a low voltage test to deliver an indication of common mode transient immunity (CMTI). The CMTI test of this disclosure may be used in a variety of applications, such as a data transmission circuit configured to communicate across galvanic isolation. Galvanic isolation of this disclosure may be implemented for example using inductive coils, such as a transformer, coreless transformers, isolation capacitors, or other elements. In the example of a transformer, including a coreless transformer, the parasitic capacitance between the primary and secondary coils may act as an additional coupling component for the data transmission.

A differential circuit, such as for data transmission, may include two input terminals and two output terminals. A differential signal at the two input terminals may be received and interpreted at the two output terminals using a variety of data transmission schemes. For robust common mode transient rejection, the first signal path from the first input terminal to the first output terminal should be the same as the second signal path from the second input terminal to the second output terminal. Differences in the resistance, inductance, and capacitance between the two signal paths may result in common mode noise being measured as a differential signal at the output terminals. Some possible causes of an impedance mismatch between the two signal paths may come from a mismatch in the data transmission (TX) driver (ZTx), a coupler mismatch (e.g., a value of L or C in inductive or capacitive signal transmission), a bonding mismatch (bonding length, bonding height, bonding contact, parasitic caps and similar bonding issues), and a receiver input impedance mismatch (ZRX).

In some other examples, tests to determine common mode transient immunity may be executed only during the design phase of a product. Such a CMTI test may involve connecting a device under test (DUT) to high voltage isolated power supplies and applying high voltage pulses, e.g., on the order of 1000 V, to the circuit, then measure the CMTI. However, individual devices that may be shipped to customers, for example, during production tests, may not receive this high voltage CMTI test because executing such testing during production may be difficult, for a variety of reasons.

In contrast, devices according to the techniques of this disclosure may be configured to enter a test mode to conduct a low voltage test that outputs a measurement of CMTI. In this disclosure, "low voltage" means a voltage much less than 1000 volts, and in some examples less than 5 volts. In some examples, the test mode for the devices according to this disclosure may include alternate signal paths on the transmit side to inject a common mode signal that may be conducted to the receive side. In some examples, the test mode may include changing the sensitivity of the receiver circuitry from a sensitivity used for normal data communication to an increased sensitivity used to detect small differences between the signals on the first signal path and the second signal path. In some examples, any measured differences between the signal paths may be used to accept or reject a device during production, e.g., based on an acceptance threshold. In other examples, the measured results may be used to make adjustments to the device to eliminate or reduce any differences in the signal paths down to an acceptable level. In some examples, the common mode test of this disclosure may be implemented as a built-in self-test (BIST) for a device.

FIG. 1 is a block diagram illustrating an example power switching system according to one or more techniques of this disclosure. In the example of FIG. 1, system 100 includes controller 102, which may send control signals to driver circuitry 104. Controller 102 may also receive sense and status signals from driver circuitry 104.

Driver circuitry 104, shown as "circuitry including isolated differential-signal transmission 104" in the example of FIG. 1, may send drive signals, and communication signals 110, to power switches 106. Driver circuitry 104 may also receive communication signals 110 from power switches 106. Some examples of communication signals 110 may include switching configuration commands to power switches 106, and status data from power switches 106, such as switch state (ON or OFF), temperature from a temperature sensor, and similar communication signals.

Driver circuitry 104 may include an isolation barrier to isolate controller 102 from the high voltages and electromagnetic interference (EMI) caused by power switch transitions of system 100. The isolation barrier of driver circuitry 104 may be implemented as galvanic isolation described above. Driver circuitry 104 may also include the data transfer circuit with the coupling component configured to conduct the communication between the first side and the second side of the galvanic isolation (not shown in FIG. 1), e.g., isolated differential-signal transmission circuitry.

In some examples, the isolated differential-signal transmission circuitry of this disclosure may include at least two communication channels. The device may include a first channel with a first transmitter on the first side of a galvanic isolation barrier configured to communicate across the isolation barrier to a first receiver on a second side of the isolation barrier. The device may further include a second channel with a second transmitter on the second side, e.g., on the side of the galvanic isolation barrier opposite from the first transmitter. The second transmitter may be configured to communicate across the isolation barrier to a second receiver on the first side of the isolation barrier, e.g., the same side as the first transmitter. Such a device may be configured to execute bi-directional communication in a test mode. In some examples, a common mode input signal may be injected from the first side to the second side using the first channel and return across the isolation barrier using the second channel. The device may be configured to measure any round-trip signal path mismatch to determine a round-trip CMTI. In other examples, the common mode signal may be injected through the first channel, and the second channel may be configured to transmit the test results by sending data across the second channel indicating the CMTI of the first channel.

Structurally, the device of this disclosure may include additional circuitry, e.g., on the controller side of the isolation barrier, that, while in test mode, may send the same signal along both signal paths of a signal channel as a common mode signal. For example, a pulse that would indicate a digital ONE when sent as a differential signal during normal mode data communication across the galvanic isolation barrier, may be sent as a common mode signal along both signal paths while in the test mode. The receiver, which may be configured to receive differential signals, may only detect this common mode test signal if, for example, there is an impedance mismatch between the first and second signal paths for a given channel. In some examples, operating in test mode, may cause the receiver to increase sensitivity to detect small differences in the common mode test signal that may output an indication of the CMTI.

In some examples, the test signal may be a pulse or other kind of waveform, such as a sine, rectangular, burst, or similar waveform, and applied to both transmission lines. The RX circuit (not shown in FIG. 1) should not detect the common mode signal unless there is some difference between the transmission lines. In some examples, driver circuit 104, or other components of system 100, may integrate the measurement function into the product to understand the internal transmission signal. For example, driver circuit 104 and one or more additional components, may be implemented on a single integrated circuit package. The circuit package may be configured to have a test mode sequence. In this manner, devices according to the techniques of this disclosure may be configured to enter a test mode to conduct a low voltage test that delivers a measurement of CMTI at any phase of production or field use. In this disclosure, "field use" describes devices installed in a final assembly or sub-assembly, such as an automobile, building control system, or some other field use.

Power switches 106 may control power output 112 to a load, such as to a motor, lighting, and similar loads. In some examples power switches 106 may convert power, e.g., DC-DC converter, inverter and similar power conversion. Power switches 106 may include full bridge, half-bridge and similar circuits with metal oxide semiconductor field effect transistors (MOSFET), insulated gate bipolar junction transistors (IGBT) or other powers switches and may be implemented with a variety of technologies including silicon carbide (SiC), gallium nitride (GaN) or other technologies.

Examples of controller 102 may include an engine control unit (ECU), body control unit (BCU), motor driver or other applications. Controller 102 and driver circuitry 104 may include processing circuitry such as any one or more of a microcontroller (MCU), e.g. a computer on a single integrated circuit containing a processor core, memory, and programmable input/output peripherals, a microprocessor (uP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Examples of a memory associated with controller 102 and/or driver circuitry 104 may include any type of computer-readable storage media such as random access memory (RAM), read only memory (ROM), programmable read only memory (PROM), erasable programmable read only memory (EPROM), one-time programmable (OTP) memory, electronically erasable programmable read only memory (EEPROM), flash memory, or another type of volatile or non-volatile memory device. In some examples the computer readable storage media may store instructions that cause the processing circuitry to execute the functions described herein. In some examples, the computer readable storage media may store data, such as configuration information, temporary values and other types of data used to perform the functions of this disclosure.

Figure 2A:
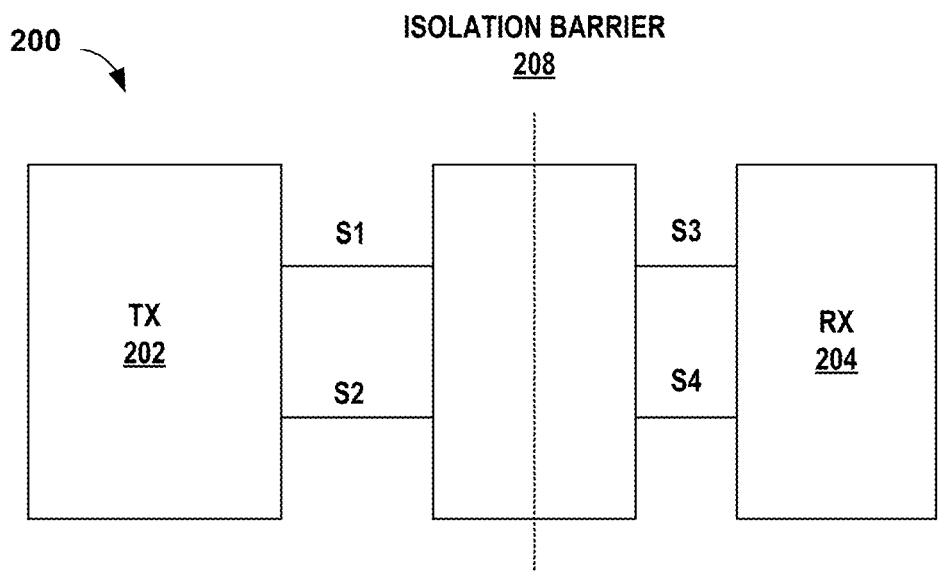
FIG. 2A is a block diagram illustrating an example circuit including an isolation barrier.

FIG. 2A is a block diagram illustrating an example circuit including an isolation barrier. The example of FIG. 2A is an example implementation of communication circuit 200 for transferring data across isolation barrier 208, as described above in relation to FIG. 1.

In the example of FIG. 2A, circuit 200 includes galvanic isolation barrier 208 with one or more coupling components configured to conduct signals across the galvanic isolation barrier. Isolation barrier 208 may be formed using a capacitive approach or an inductive approach (not shown in FIG. 2A). In the example implementation using a transformer for the inductive approach to implement the galvanic isolation barrier (not shown in FIG. 2A), in addition to a primary and secondary coil that act as coupling components, a transformer may further include a parasitic capacitor between the primary coil and the secondary coil of the transformer. The coils of a transformer, or inductor, in this disclosure may also be referred as a winding, e.g., a primary winding and secondary winding.

Circuit 200 includes isolated differential-signal communication circuitry, that include the coupling components to conduct data signals across isolation barrier 208. Circuit 200 includes transmit circuit (TX) 202 and receive circuit (RX) 204. The isolated differential-signal communication circuitry includes a first signal path a first input terminal S1 and a first output terminal S3. Circuit 200 also includes a second signal path with a second input terminal S2 and a second output terminal S4. The first input terminal S1 and the second input terminal S2 are located on a first side of galvanic isolation barrier 208. The first output terminal S3 and the second output terminal S4 are located on a second side of galvanic isolation barrier 208 opposite the first side.

Circuit 200 may receive differential input signals at S1 and S2 and transfer the signals across isolation barrier 208 to differential output signals S3 and S4. Circuit 200 may use a variety of communication schemes to transfer data from TX 202 to RX 204.

Figure 2B:
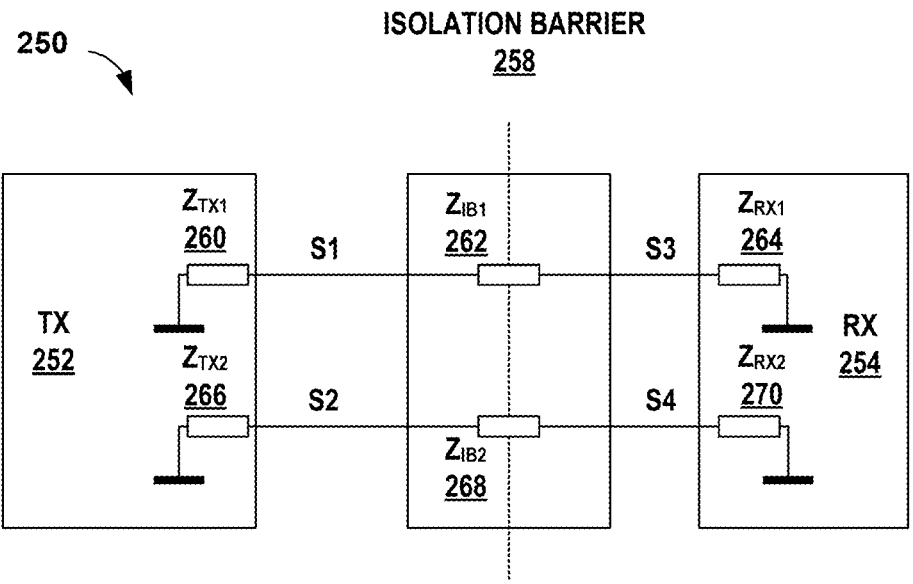
FIG. 2B is a schematic diagram illustrating an example model of signal paths for an isolated differential-signal transmission circuit according to one or more techniques of this disclosure.

FIG. 2B is a schematic diagram illustrating an example model of signal paths for an isolated differential-signal transmission circuit according to one or more techniques of this disclosure. Circuit 250 in the example of FIG. 2B is another representation of circuit 200 of FIG. 2A and may be the same or similar representation of isolated differential-signal transmission circuitry of driver circuitry 104 described above in relation to FIG. 1.

As with circuit 200, circuit 250 includes galvanic isolation barrier 258 with one or more coupling components configured to conduct signals across the galvanic isolation barrier. Isolation barrier 258 may be also formed using a capacitive approach or an inductive approach (not shown in FIG. 2B).

Circuit 250 includes transmit circuit (TX) 252 and receive circuit (RX) 254. The first signal path in circuit 250 includes first input terminal S1 and a first output terminal S3. The first signal path also includes impedance from the transmit (driver) circuitry ZTX1 260, isolation barrier impedance ZIB1 262 and receiver impedance ZRX1 264.

Circuit 250 also includes a second signal path with a second input terminal S2 and a second output terminal S4. The second signal path also may include impedance from the transmit (driver) circuitry ZTX2 266, isolation barrier impedance ZIB2 268 and receiver impedance ZRX2 270.

The impedances in the first and second signal paths may be caused by bonding, e.g., solder joints, conductive adhesive, wire bonding and similar bonding techniques as well as the components in the signal paths. In some examples, impedance mismatch may be caused by driver mismatch, such as a mismatch between ZTX1 260 and ZTX2 266. In some examples, impedance mismatch may be caused by receiver input impedance mismatch between ZRX1 264 and ZRX2 270. Other possible causes of mismatch may also include a coupler mismatch, such as a value of L or C in inductive or capacitive signal transmission, as well as bonding mismatch, e.g., bonding length, bonding height, bonding contact, parasitic capacitance between signal paths, or other causes.

The isolated differential-signal communication circuitry of circuit 250 sends signals across isolation barrier 258 by sending differential signals across the two signal paths from TX 252 that can be decoded and interpreted by RX 254. For communication purposes, RX 254 should ignore any common mode signals on the first and second signal paths. The degree to which RX 254 can ignore a common mode signal is an indication of the CMTI for circuit 250. But a mismatch in the impedances of the differential signal path may convert common mode noise into a differential signal which can be detected at RX 254 as a valid signal, and therefore be misinterpreted as a communication signal.

Figure 3A:
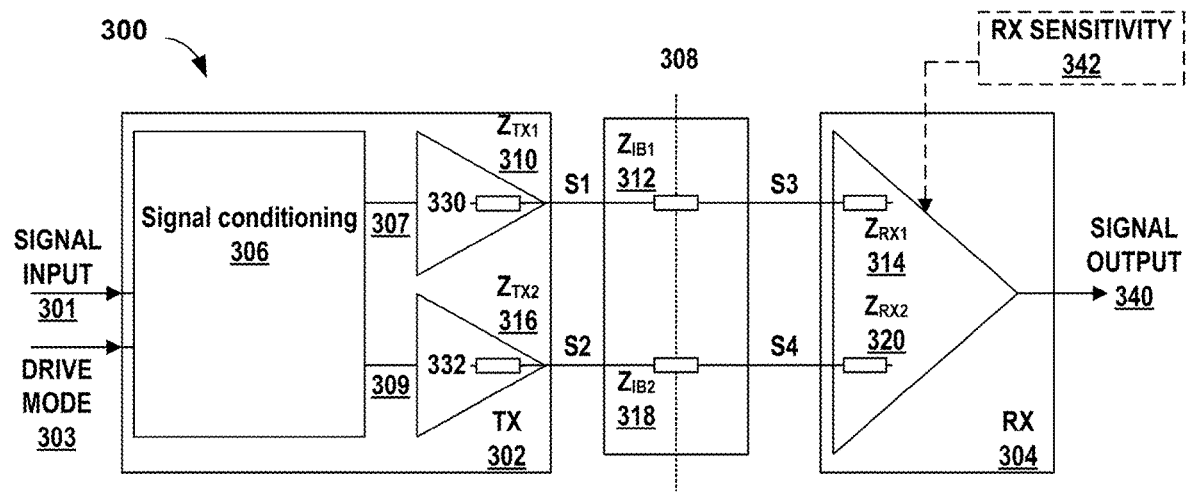
FIGS. 3A and 3B are schematic diagrams illustrating different example implementations of the test mode circuitry according to one or more techniques of this disclosure.
Figure 3B:
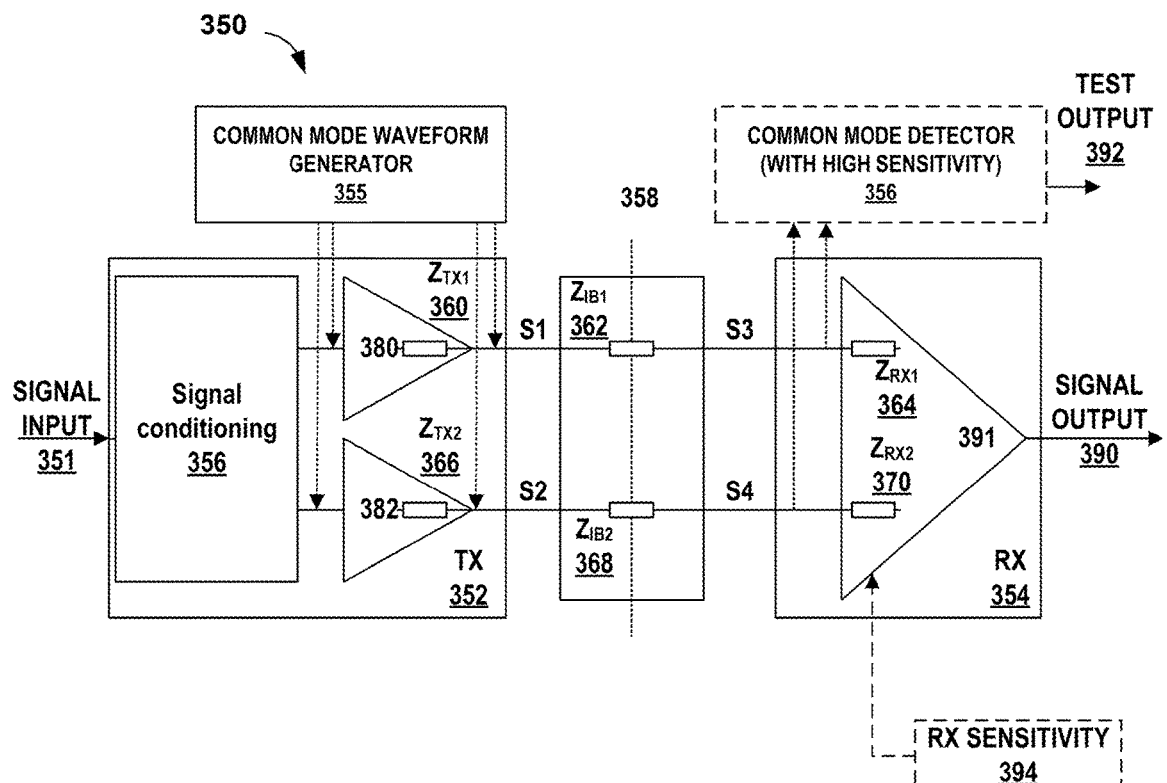

FIGS. 3A and 3B are schematic diagrams illustrating different example implementations of the test mode circuitry according to one or more techniques of this disclosure. As with circuits 200 and 250 described above in relation to FIGS. 2A and 2B, circuits 300 and 350 of FIGS. 3A and 3B are example representations of the isolated differential-signal transmission circuitry of driver circuitry 104 described above in relation to FIG. 1. As with circuits 200 and 250, circuit 300 includes galvanic isolation barrier 308 with one or more coupling components configured to conduct signals across the galvanic isolation barrier (not shown in FIG. 3A).

Transmit circuit (TX) 302 includes signal conditioning circuit 306 configured to receive signal input 301 as well as drive mode signal 303. Signal input 301 may be used for normal differential-signal transmission operation, such as switching configuration commands, switch state signals, status signals and similar communications as described above in relation to FIG. 1. The second input terminal, drive mode 303, may activate a test mode so that a common mode signal is applied to the impedances of both the signal transmission lines. In some examples, activating drive mode 303 to place TX 302 in test mode may reconfigure signal conditioning circuit 306 such that signal conditioning circuit 306 may apply a test signal injected at signal input 301 to both signal paths 307 and 309. In test mode, a mismatch in the impedances of the transmission lines, which could degrade the CMTI, may be detected at signal output 340 of RX 304. Such a degradation of CMTI may be detected by the high voltage, long-term testing described above. In addition, the isolated differential-signal communication circuitry of this disclosure may detect an impedance mismatch that may cause CMTI degradation during production test or in the field, as described above in relation to FIG. 1.

TX 302 connects to first signal path 307 and second signal path 309, which connects Rx 304 to TX 302 across isolation barrier 308. First signal path 307 includes an amplifier, driver 330, input terminal S1, the coupling components of isolation barrier 308, output terminal S3 and RX 304. The modeled impedances of signal path 307 include from the transmit (driver) circuitry ZTX1 310, isolation barrier impedance ZIB1 312 and receiver impedance ZRX1 314.

Second signal path 309 includes second input terminal S2, the coupling components of isolation barrier 308, second output terminal S4 and RX 304. The modeled impedances of second signal path 309 include the impedance from the transmit circuitry ZTX2 316, isolation barrier impedance ZIB2 318 and receiver impedance ZRX2 320.

In the example of FIG. 3A, the differential output stage RX 304, which is already needed for normal operation may be used also for receiving the common mode test signal applied to the transmission lines 307 and 309. In some examples, RX 304 may optionally include a sensitivity mode change input, RX sensitivity 342. RX sensitivity 342 may reconfigure receiver circuitry, RX 304 to have higher sensitivity to detect small differences between the common mode signals applied to signal paths 307 and 309 while in test mode. Increasing the sensitivity of RX 304 may be desirable to detect impedance mismatches between the signal paths. One example implementation to change receiver sensitivity may be to use a differential comparator in the receiver circuit of RX 304. During normal data transfer operation, the threshold for the differential comparator may be relatively high, e.g., to make the operation of RX 304 robust and reliable. In test mode, the threshold may be set to a lower value relative to the normal operation threshold, to detect small differences in the signal paths and a reduced CMTI. In some examples, while in test mode, the threshold may be set to a lower value relative to the normal operation threshold, to detect small differences in impedances in the signal paths that could reduce the CMTI.

Circuit 350 in the example of FIG. 3B has a similar arrangement to circuit 300 of FIG. 3A, e.g., circuit 350 includes galvanic isolation barrier 358 with coupling components, a first signal path with driver 380, input terminal S1, output terminal S3 and modeled by impedances from transmit circuitry ZTX1 360, isolation barrier impedance ZIB1 362 and receiver impedance ZRX1 364. Similarly, the second signal path driver 382, input terminal S2, output terminal S4 and modeled by impedances from transmit circuitry ZTX2 366, isolation barrier impedance ZIB2 368 and receiver impedance ZRX2 370.

Similar to circuit 300 of FIG. 3A, signal input 351 may be used for normal differential-signal transmission operation to send communication signals to signal output 390 of differential comparator 391. For test mode, circuit 350 may also include test signal generation circuitry, e.g., common mode waveform generator 355. In some examples, common mode waveform generator 355 may be integrated with the isolated differential-signal communication circuitry of circuit 350, e.g., implemented as circuitry on the same integrated circuit die, or on a separate die on the same integrated circuit package. In other examples, circuit 350 may include connections to a separate common mode waveform generator 355.

Common mode waveform generator 355 may be configured to inject a common mode test signal at any of several points of TX 352. For example, at a first time, common mode waveform generator 355 may inject a common mode signal at the input to driver 380 and driver 382. At a second time common mode waveform generator 355 may inject the common mode test signal at the output of driver 380 and driver 382. In fact, there may be several more possibilities (not shown in FIG. 3B) to inject a common mode voltage to the system using common mode waveform generator 355. In other words, the test mode circuitry is configured to cause an input signal to be injected to both the first signal path and the second signal path at a location in the first signal path and the second signal path different from the first input terminal and the second input terminal (which are not shown in FIG. 4).

In some examples, the mismatch in the impedances of the transmission lines, which could degrade the CMTI, may be detected at signal output 390 of RX 354, as described above in relation to FIG. 3A. In some examples, output comparator 391 may change sensitivity based on RX sensitivity signal 394. In other examples a second, optional receiver circuit with high sensitivity, e.g., common mode detector circuit 356, may be configured to determine mismatch in the two signal paths and output the results via test output 392. In other words, the example of circuit 350 may include both a first receiver RX 354, configured to output an indication of a difference between the input signals on the first signal path and the second signal path. Circuit 350 may also optionally include a second receiver, e.g., common mode detector 356, which may be configured to deliver test output 392 based on the difference between common mode test signals from the first signal path and the second signal path When drive mode 303 is activated, the common mode test signal, e.g., injected at signal input 301 or from common mode waveform generator 355, may be any of several different types of waveforms. Some examples may include, a sine wave, a rectangular wave, a single pulse, a burst of pulses, a triangular wave, a stepped waveform or any other test signal or combination of test signal waveforms.

Figure 4:
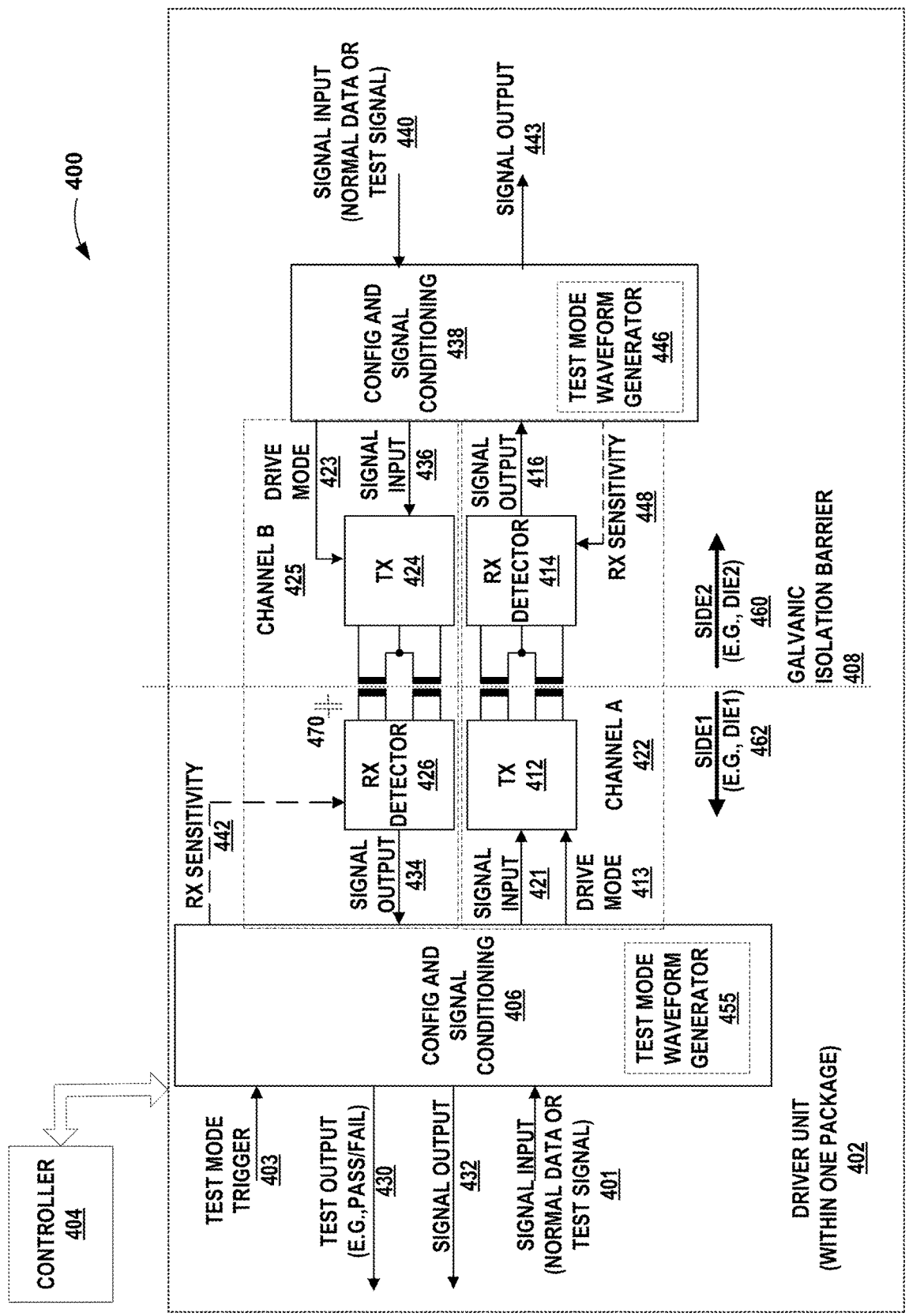
FIG. 4 is a block diagram illustrating an example implementation of a circuit with test mode circuitry to output an indication of the common mode robustness of the circuit, according to one or more techniques of this disclosure.

FIG. 4 is a block diagram illustrating an example implementation of a circuit with test mode circuitry to deliver an indication of the common mode robustness of the circuit, according to one or more techniques of this disclosure. System 400 is an example of systems 100-350 described above in relation to FIGS. 1-3B. In the example of FIG. 4, system 400 includes controller 404, which may send control signals and configuration commands to driver unit 402. Driver unit 402 is an example of driver circuit 104 of FIG. 1 and may have the same or similar functions and characteristics, including isolated differential-signal transmission circuitry. The isolated differential-signal transmission circuitry of driver unit 402 may convey control signals, commands, data and other communications across galvanic isolation barrier 408.

An isolation barrier, such as a galvanic isolation barrier of this disclosure, may be useful for systems with different voltage domains. For example, some aircraft, automobiles and similar systems may have some voltage domains that are several hundred volts different from each other. For example, some electric and hybrid vehicles may have a voltage domain in the range between 400V to 800V. In some applications, such high voltages have to be isolated from chassis ground of the vehicle. In typical automotive applications, controller 404 may refer to chassis ground of the vehicle. If data has to be exchanged between these different voltage domains, the difference between the reference potentials may benefit from a separation of the circuit parts, for example by an isolation barrier such as galvanic isolation barrier 408. Depending on the relation of the different reference voltages, a galvanic isolation may be used as isolation barrier in one example, whereas in another example, a level-shifter based isolation may be sufficient.

The isolation barriers separate the parts of the systems 100-400, described above, according to the reference potentials. For example, one side of isolation barrier 408 refers to the reference potential of the controller 404. This side may be called "primary side." The other side of isolation barrier 408 refers to the reference potential of power switches, motor or other power circuitry (not shown in FIG. 4 and described above in relation to FIG. 1). This power side may be called "secondary side". Some data may be transferred from the primary side to the secondary side by using a data transmitter (TX) on the primary side and a data receiver (RX) on the secondary side, e.g., like TX 412 and RX 414. Other data may by transferred from the secondary side to the primary side by using a data transmitter (TX) on the secondary side and a data receiver (RX) on the primary side, e.g., like TX 424 and RX 426.

In some examples system 400 may be implemented on a single integrated circuit package. In some examples, one or more components on the primary side, such as signal conditioning circuit 406, RX detector 426 and TX 412 may be implemented on a first die, e.g., side 1 462. The secondary side components may be implemented on a second die, e.g., side 2 460. Galvanic isolation 408 in the example of FIG. 4 is a differential transformer, or a pair of individual transformers for each channel, and may include a coreless transformer.

There are different types of coupling components available to build a communication channel bridging a galvanic isolation barrier, such as opto-electronic couplers, magnetic/inductive couplers, and capacitive couplers. Each type of these coupling components has specific properties, e.g., relating to aging, temperature dependencies, EMI robustness, power consumption, latency, bandwidth, coupling capacitance, etc. and has to be selected according to the requirements of the application. A parameter of a coupling component may include the resulting coupler capacitance between the primary side and the secondary side. For example, the magnetic coupling components in the dual transformer of channel A 422 and channel B 425 may also include parasitic capacitor on each signal path. To simplify the figure, only a single parasitic capacitor 470 is shown for Channel B 425.

As described above in relation to FIGS. 1-3B, isolated differential-signal transmission circuitry includes a first signal path and a second signal path with the first input terminal and the second input terminal are located on a first side of the galvanic isolation barrier, and the first output terminal and the second output terminal are located on a second side of the galvanic isolation barrier opposite the first side. For example, channel A 422 may communicate configuration commands, and other information across galvanic isolation barrier 408 using any of a variety of communication schemes that operate by applying a differential signal to the first path and the second path (not shown in FIG. 4) of channel A 422. Similarly, channel B 425 may communicate status messages, alert messages, data, and other information across galvanic isolation barrier 408 by applying a differential signal to the first path and the second path (not shown in FIG. 4) of channel B 425.

As described above in relation to FIGS. 1-3B, a mismatch between the first signal path and the second signal path, e.g., in impedance, latency or similar characteristics, may cause common mode noise on the respective channel to be interpreted by the respective receiver circuitry as a differential signal, e.g., by RX detector 426 of channel B 425 or RX detector 414 of channel A. Such common mode noise may erroneously be interpreted as a valid command, data or some other communication.

As described above in relation to FIG. 3B, in some examples a communication channel may have a signal input terminal and a mode input terminal. For example, signal input 421 may be used for normal differential-signal transmission operation, such as switch state signals and similar communications as described above in relation to FIG. 1. The second input, drive mode 413 may activate a test mode so that a common mode signal is applied to the impedances of both the signal transmission lines of the first signal path and second signal path of channel A 422. Similarly, signal input 436 may be used for normal differential-signal transmission operation and drive mode 423 may activate a test mode so that a common mode signal is applied to the impedances of both the signal transmission lines of the first signal path and second signal path of channel B 425.

Said another way, drive mode 413 output from control logic, config and signal conditioning circuit 406, may place the circuitry for TX 412 for channel A 422 into either normal operating mode or test mode. In normal operating mode, TX 412 may send data, received from signal input 421, across galvanic isolation barrier 408 to RX detector 414 using differential signal transmission. In test mode, TX 412 may send signal input 421 to RX detector 414 as a common mode signal across both signal paths. In some examples, the test mode signal may come from, e.g., controller 404 via signal input terminal 401. In other examples, test mode waveform generator 455 may generate the test mode signal for channel A 422. Similarly, for channel B, controller 404 may inject the test mode signal via signal input terminal 440 in some examples, while in other examples, test mode waveform generator 446 may inject the test mode signal to both signal paths of channel B 425. In other words, for channel B 425, while in test mode, the test mode circuitry is configured to cause an input signal to be injected to both the first input terminal and the second input terminal of TX 424 of channel B 425.

In other examples, as described above in relation to FIG. 3B, channel A 422 and channel B 425 may not have a drive mode terminal and instead test mode waveform generator 455, for channel A 422, or test mode waveform generator 446, for channel B 425, may inject a common mode test signal at different locations of the communication circuitry while in test mode. In other examples, the isolated differential-signal communication circuitry may have some combination of a drive mode terminal and test mode waveform generation circuitry.

In some examples, the test mode for the circuitry of driver unit 402 may be based on a test mode trigger signal, e.g., at test mode trigger input terminal 403. The test mode trigger may come from controller 404 or some other source within the system. In some examples, initiating the test mode may also initiate an optional change to receiver sensitivity, as described above in relation to FIGS. 3A and 3B, e.g., via RX sensitivity mode signal 442 and/or RX sensitivity mode signal 448. In some examples, the common mode test results may be evaluated based on signal output 416 and/or signal output 443, for channel A 422, or based on signal output 434 and/or signal output 432, for channel B 425. In other examples, an optional second test mode receiver, with higher sensitivity than the normal receiver circuitry may evaluate the injected common mode test signals (not shown in FIG. 4) as described above in relation to FIG. 3B.

The example of FIG. 4 includes a first isolated differential-signal communication circuitry, e.g., channel A 422. System 400 further includes a second isolated differential-signal communication circuitry, channel B 425. Channel B 425 is configured to conduct signals across galvanic isolation barrier 408 in a direction opposite to signals conducted by channel A 422. Though the example of FIG. 4 includes only two channels, the circuits of this disclosure may include any number of channels in either direction across galvanic isolation barrier 408.

In some examples, while in test mode, circuitry of driver unit 402, e.g., signal conditioning circuit 438, may evaluate any differences in the signal paths of channel A 422 and determine an indication of the common mode transient immunity for channel A 422. In some examples, signal conditioning circuit 438, or some other circuitry of driver unit 402, may determine an indication of the common mode transient immunity for channel A 422 based on any differences in the signal path, e.g., differences in impedance, latency or other measured characteristics. In some examples, channel B 425 may conduct data indicating the CMTI of channel A 422 based on an input signal injected to channel B 425, e.g., by the test mode circuitry, by signal conditioning circuit 438, or by some other portion of driver unit 402. In some examples, controller 404 may receive the output of the test results, such as PASS or FAIL via a test results terminal, e.g., test output 430. In some examples, the signal to test mode trigger 403 may initiate a built-in self test (BIST) for driver unit 402. The BIST may include any one or combination of tests described herein. In some examples, the BIST, or under the control of controller 404, may initiate a sequence of tests described herein and output an indication of CMTI based on the sequence and/or combination of tests.

In some examples, the test mode circuitry of driver unit 402 may be configured to determine an indication of a combined CMTI both channel A 422 and for channel B 425 based on an input signal injected to channel A 422 by the test mode circuitry. In other words, while in test mode, the test mode circuitry may determine and output an indication of a round-trip CMTI for a communication signal traveling through both channel A 422 and channel B 425. The test may start in either direction, e.g., start with channel B 425 and return through channel A 422, to determine an indication of a combined CMTI.

Figure 5A:
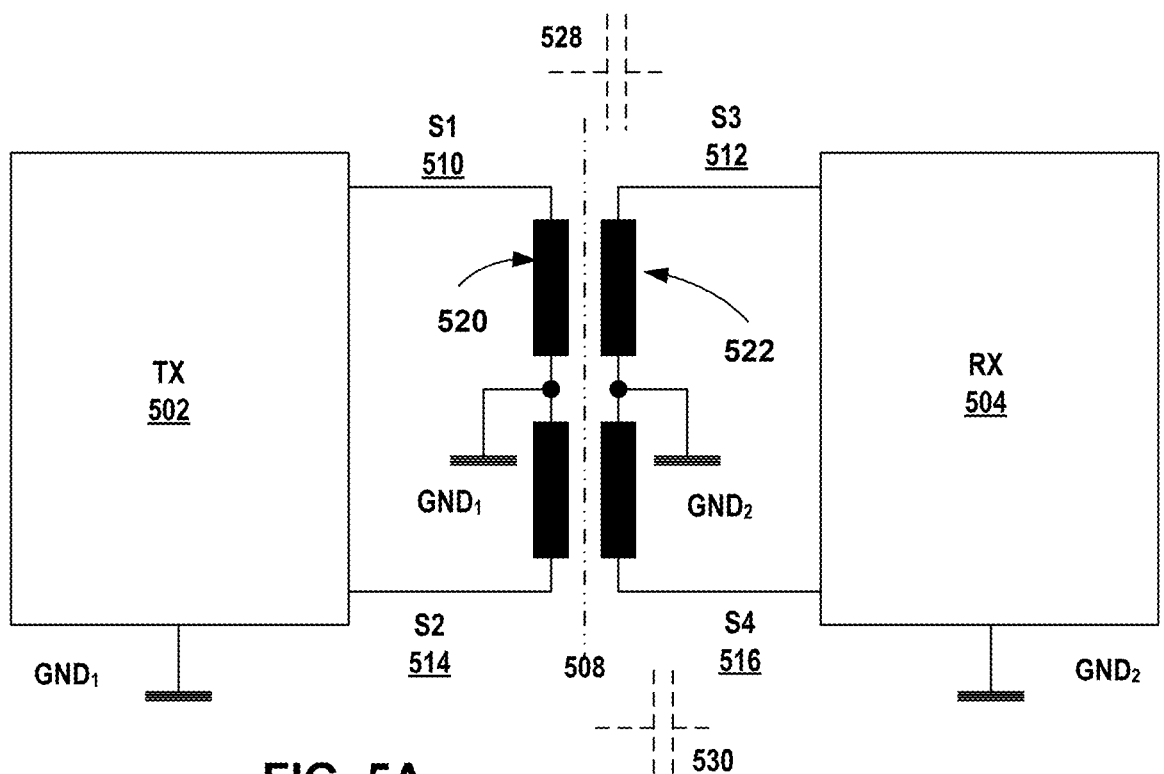
FIGS. 5A and 5B are conceptual diagrams illustrating example implementations of a galvanic isolation barrier according to one or more techniques of this disclosure.
Figure 5B:
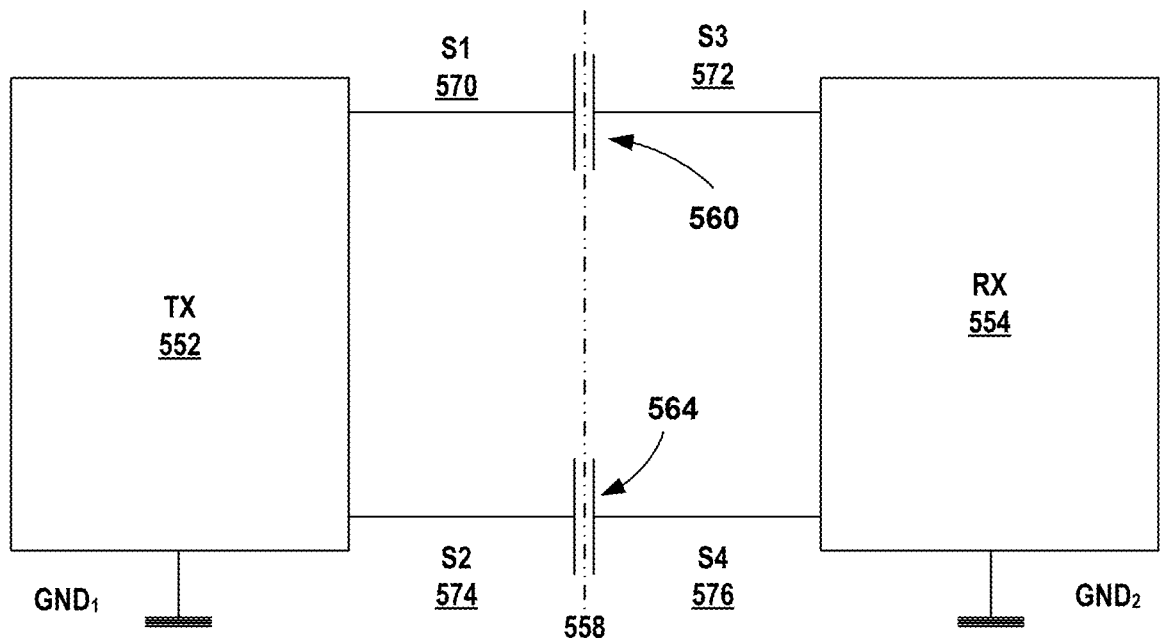

FIGS. 5A and 5B are conceptual diagrams illustrating example implementations of a galvanic isolation barrier according to one or more techniques of this disclosure. As described above, e.g., in relation to FIG. 2A, the isolation barrier of this disclosure may be formed using a capacitive approach or an inductive approach. FIG. 5A illustrates an example implementation using a differential transformer for the inductive approach to implement galvanic isolation barrier 508. The top transformer (as drawn on the page of FIG. 5A) includes a primary coil 520 and secondary coil 522 that are inductively coupled. To simplify the figure the primary and secondary coils of the bottom transformer are not labeled. In some examples the transformers of FIG. 5A may be coreless transformers.

In addition to a primary and secondary coil that act as coupling components, a transformer may further include a parasitic capacitor between the primary coil and the secondary coil of the transformer. The top transformer may include parasitic capacitor 528 and the bottom transformer may include parasitic capacitor 530. Parasitic capacitors 528 and 530 are the same or similar to parasitic capacitor 470 described above in relation to FIG. 4.

As described above in relation to FIGS. 2A-4, the isolated differential-signal transmission circuitry of FIG. 5A includes a first signal path with a first input terminal S1 510 and a first output terminal S3 512 that connects transmit circuitry TX 502 to receive circuitry RX 504. FIG. 5A also illustrates a second signal path with second input terminal S2 514 and a second output terminal S4 516.

As described above in relation to FIG. 4, isolation barrier 508 may separate two voltage domains with difference between the reference potentials. In the example of FIG. 5A the "primary side," with TX 502, may refer to GND1 as a reference. The "secondary side," with RX 504, may use GND2 as a reference potential. As described in FIG. 4, in some examples, TX 502 or RX 504 may be reversed across isolation barrier 508.

The example of FIG. 5B illustrates one example of a capacitive approach for an isolation barrier. Isolation barrier 558 is formed by capacitors 560 and 564. The "primary side," with TX 552, may refer to GND1 as a reference. The "secondary side," with RX 554, may use GND2 as a reference potential.

The isolated differential-signal transmission circuitry of FIG. 5B includes a first signal path with a first input terminal S1 570 and a first output terminal S3 572 that connects transmit circuitry TX 552 to receive circuitry RX 554. FIG. 5A also illustrates a second signal path with second input terminal S2 574 and a second output terminal S4 576.

Figure 6:
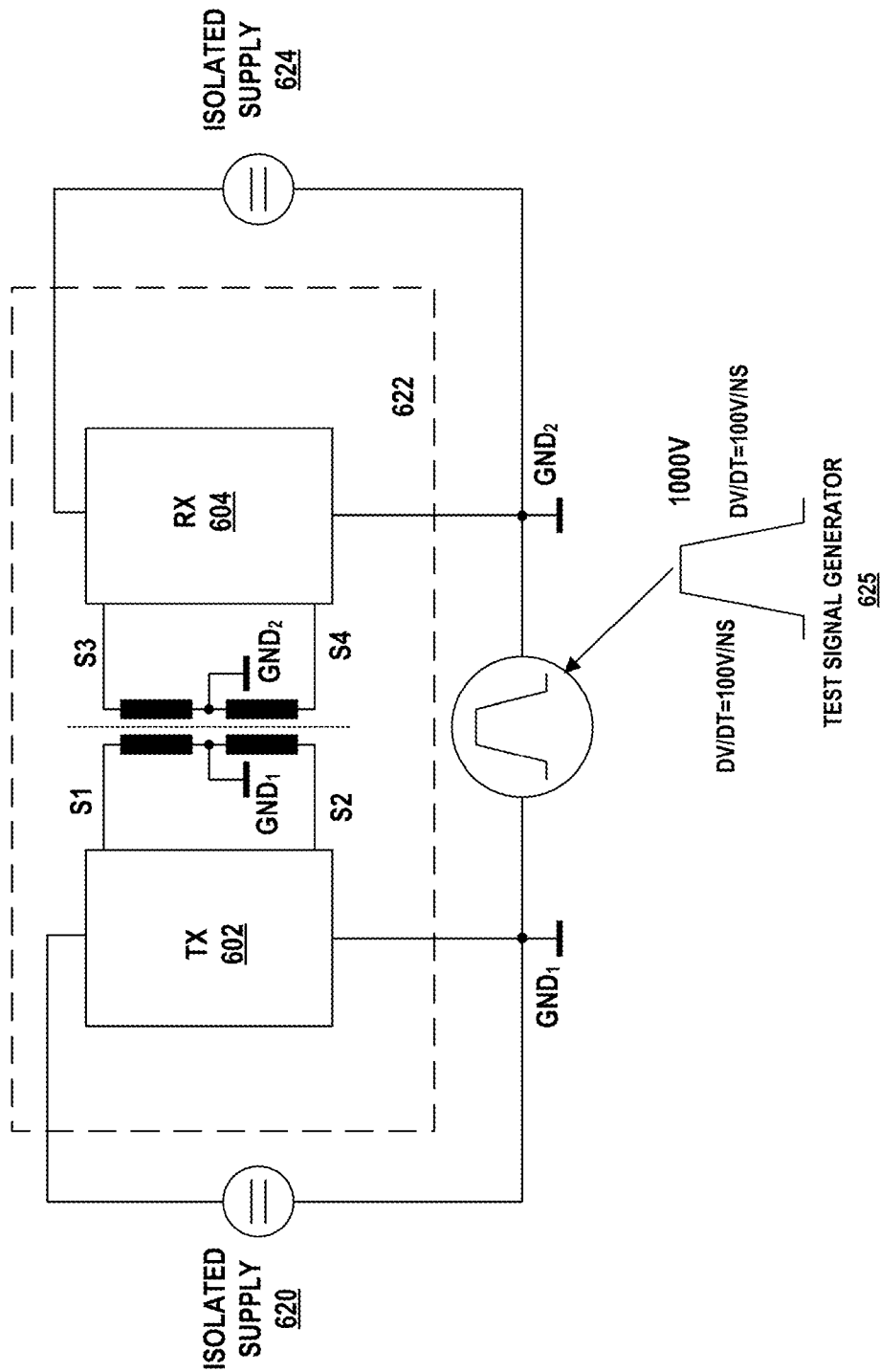
FIG. 6 is an example test circuit for applying a high voltage CMTI test to an isolated communication circuit.

FIG. 6 is an example test circuit for applying a high voltage CMTI test to an isolated communication circuit. The example of FIG. 6 illustrates an example isolated differential-signal transmission circuit 622 with a first signal path and a second signal path that connects transmit circuitry TX 602 to receive circuitry RX 604, which is the same as the circuit described above in relation to FIG. 5A. The test circuit includes a first isolated supply 620 and a second isolated supply 624 configured to apply a normal drive voltage to operate circuit 622. In some examples the test for CMTI may take several days to a week or more, which is impractical for a production test, or a field test.

In the example of FIG. 6, the test signal generator 625 applies the test signal, which is shown as a 1000V pulse with a slew rate DV/DT of 100 volts per nanosecond (ns). In other examples, the test signal may have different parameters, e.g., different voltage and slew rate, as well as a different configuration, such as a sine wave, rectangular waveform, or some combination of several waveforms.

The comparison of common mode injected test signal of this disclosure, described above in relation to FIGS. 1-5 may result in an indication of the CMTI. In other words, testing the impedance, latency, and other characteristics of the first signal path and second signal path may give an indication of the CMTI results that the test circuit of FIG. 6 the same circuit would have delivered. However, as noted above, the high voltage CMTI test may take several days and require specialized equipment, while the signal path comparison test of this disclosure may take much less time, e.g., in some examples less than a second, and may be executed in the field, during production testing or other similar circumstances.

The isolated differential-signal transmission circuitry of this disclosure may be applied to a variety of applications. Some examples may include power output to a load, such as a motor or other loads described above in relation to FIG. 1. Other example applications may include communication circuitry for other power transistor gate drivers, couplers, and similar products. In some examples, signal chain may be within a single integrated isolated galvanic device, as described above in relation to FIG. 4. In some examples, the driver circuitry using communication across an isolation barrier, e.g., driver unit 402 of FIG. 4, may include driver circuits with variable characteristics. The test mode circuitry of this disclosure may generate and evaluate different test signals to account for differences in the driver circuit, such as to increase amplitude, change the slew rate, and adjust other test signal parameters.

Figure 7:
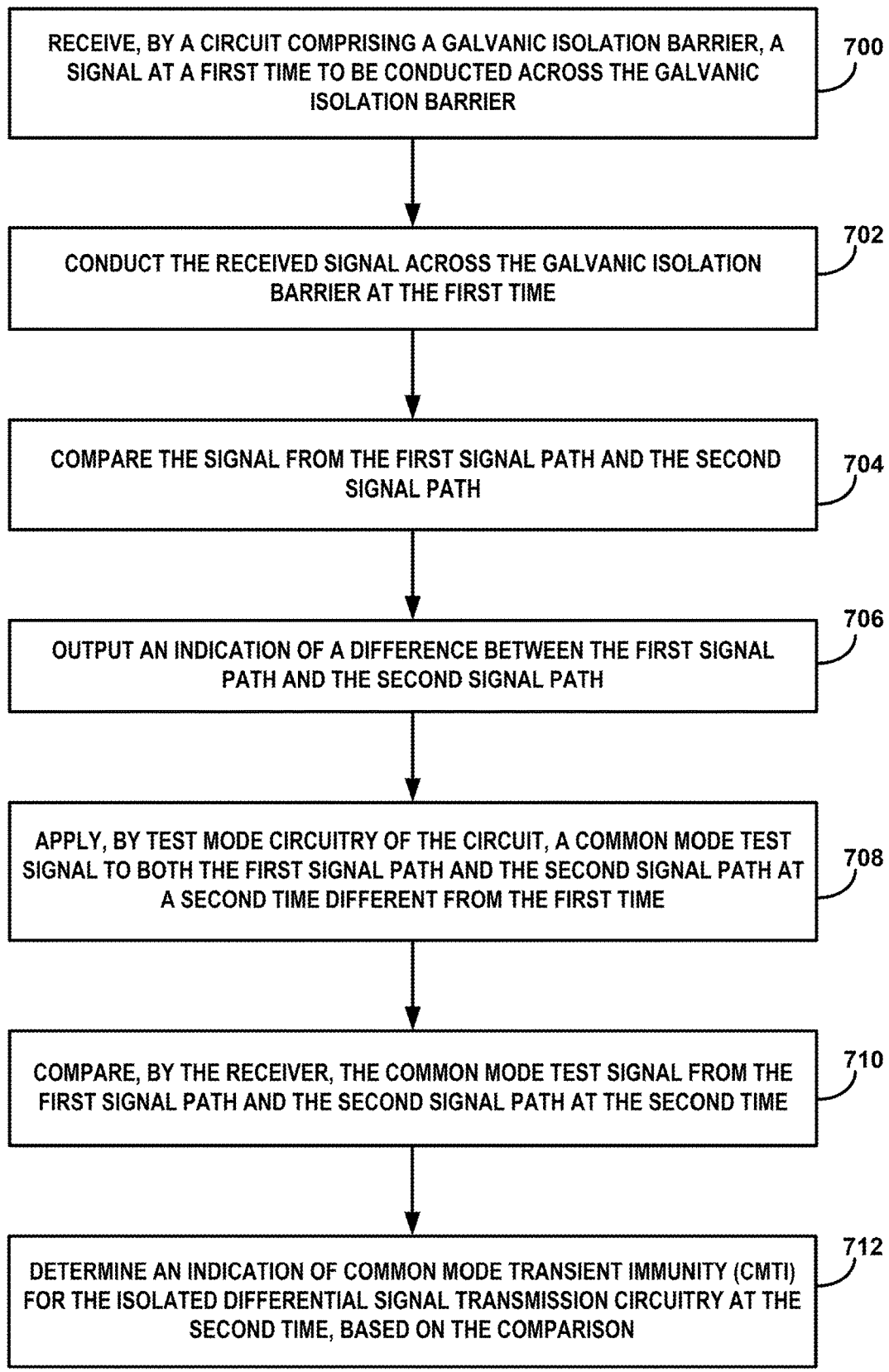
FIG. 7 is a flow chart illustrating an example operation of the test mode and normal operating mode for a circuit of this disclosure.

FIG. 7 is a flow chart illustrating an example operation of the test mode and normal operating mode for a circuit of this disclosure. The blocks of FIG. 7 will be described in terms of FIGS. 3A and 3B unless otherwise noted. As described above in relation to FIGS. 1-5B, a driver circuit, or other similar circuit, may include isolated differential-signal communication circuitry to communicate across an isolation barrier. During normal operating mode, the communication circuitry may conduct data, commands, and other communication signals across the isolation barrier for a first time period, e.g., for a first duration. The isolated differential-signal communication circuitry may also include a test mode for generating an indication of the CMTI for the communication circuitry at some other time period, e.g., for some second duration. As described above, test mode be useful during production testing of individual components or assemblies, or periodically during field use, such as to troubleshoot an error message.

During normal mode operation, circuit 300 may receive a signal at signal input 301 at a first time to be conducted across galvanic isolation barrier 308 (700). The first signal path 307 and second signal path 309 may conduct the received signal across galvanic isolation barrier 308 at the first time (702).

Normal mode operation may use a differential communication scheme, where differences between the signal through the first signal and the second signal path conveys a message. For example, a positive difference at signal output 340 of RX 304 may indicate a digital ONE while a negative difference, or no difference may indicate a digital ZERO. In some examples, a positive difference may be that the voltage at output terminal S3 is greater than the voltage at output terminal S4, which RX 304 may detect.

RX 304 may compare the signal from the first signal path and the second signal path (704) and output an indication of a difference between the first signal path and the second signal path (706). Other system circuitry, e.g., configuration and signal conditioning circuit 438 of FIG. 4 may receive the indication of the difference, decode the communication message and take some other action. Other actions may include to configure the operation of power switches, e.g., increase or decrease a dead time for a half-bridge circuit, change a switching slew rate, operate a switch, or perform some other action.

While in test mode, test mode circuitry of the circuit may apply a signal injected at signal input 301, for example, to both signal paths 307 and 309 of FIG. 3 (708). In some examples, the "test mode circuitry" may include signal conditioning circuit 306 reconfigured to apply the common mode test signal rather than a differential path, common mode waveform generator 355 or some similar circuitry as described above in relation to FIGS. 3A, 3B and 4.

The receiver may compare the common mode test signal from the first signal path and the second signal path at the second time, e.g., while in test mode rather than in normal operating mode (710). In some examples the receiver for the common mode test signal is the same receiver circuitry that is used for normal mode operation, e.g., RX 304 of FIG. 3A. RX 304 may output the comparison via signal output 340 to circuitry configured to evaluate the results, e.g., logic circuitry within configuration and signal conditioning circuit 438, or some similar circuit. In other examples, the receiver for the test signal is a second receiver, such as common mode detector 356 described above in relation to FIG. 3B. Test mode circuitry may determine an indication of common mode transient immunity (CMTI) for the isolated differential-signal transmission circuitry (712) based on the comparison of the common mode test signal from the first signal path and the second signal path, as described above in relation to FIGS. 1-4.

The techniques of this disclosure may also be described in the following clauses.

Clause 1: A circuit comprising a galvanic isolation barrier comprising one or more coupling components configured to conduct signals across the galvanic isolation barrier; isolated differential-signal communication circuitry comprising the coupling components; test mode circuitry configured to determine an indication of CMTI for the isolated differential-signal communication circuitry.

Clause 2: The circuit of clause 1, wherein the circuit is implemented on a single integrated circuit package.

Clause 3: The circuit of any of clauses 1 and 2, wherein a transformer is the galvanic isolation barrier, and wherein the one or more coupling components further comprise a parasitic capacitor between a primary coil and a secondary coil of the transformer.

Clause 4: The circuit of any of clauses 1 through 3, wherein the isolated differential-signal transmission circuitry comprising: a first signal path comprising a first input terminal and a first output terminal; and a second signal path comprising a second input terminal and a second output terminal, wherein the first input terminal and the second input terminal are located on a first side of the galvanic isolation barrier, and wherein the first output terminal and the second output terminal are located on a second side of the galvanic isolation barrier opposite the first side.

Clause 5: The circuit of any of clauses 1 through 4, wherein the test mode circuitry is configured to cause an input signal to be injected to both the first input terminal and the second input terminal.

Clause 6: The circuit of any of clauses 1 through 5, wherein the input signal includes one or more of: a sine wave, a rectangular wave, a burst of pulses, a triangular wave, and a stepped waveform.

Clause 7: The circuit of any of clauses 1 through 6, the test mode circuitry further comprising test signal generation circuitry configured to generate the input signal.

Clause 8: The circuit of any of clauses 1 through 7, wherein the test mode circuitry is configured to cause the input signal to be injected to both the first input terminal and the second input terminal based on receiving a drive mode signal.

Clause 9: The circuit of any of clauses 1 through 8, wherein the test mode circuitry is configured to cause an input signal to be injected to both the first signal path and the second signal path at a location in the first signal path and the second signal path different from the first input terminal and the second input terminal.

Clause 10: The circuit of any of clauses 1 through 9, wherein the isolated differential-signal transmission circuitry comprises: a first receiver configured to output an indication of a difference between the input signals on the first signal path and the second signal path; a second receiver configured to deliver a test output based on the difference between common mode test signals from the first signal path and the second signal path.

Clause 11: The circuit of any of clauses 1 through 10, wherein the isolated differential-signal transmission circuitry comprises a receiver configured to: compare signals from the first signal path and the second signal path; output an indication of a difference between the signals from the first signal path and the second signal path; adjust a sensitivity of the receiver based on a receiver sensitivity command from the test mode circuitry.

Clause 12: The circuit of any of clauses 1 through 11, wherein the isolated differential-signal communication circuitry is a first isolated differential-signal communication circuitry, the circuit further comprising a second isolated differential-signal communication circuitry configured to conduct signals across the galvanic isolation barrier in a direction opposite to signals conducted by the first isolated differential-signal communication circuitry.

Clause 13: The circuit of any of clauses 1 through 12, wherein the test mode circuitry is configured to determine an indication of a combined CMTI for the first isolated differential-signal communication circuitry and the second isolated differential-signal communication circuitry based on an input signal injected to the first isolated differential-signal communication circuitry by the test mode circuitry.

Clause 14: The circuit of any of clauses 1 through 13, wherein the second isolated differential-signal communication circuitry conducts data indicating the CMTI of the first isolated differential-signal communication circuitry based on an input signal injected to the first isolated differential-signal communication circuitry.

Clause 15: A system comprising a controller including processing circuitry; a circuit comprising a galvanic isolation barrier comprising one or more coupling components configured to conduct signals across the galvanic isolation barrier; isolated differential-signal communication circuitry comprising the coupling components; test mode circuitry configured to determine an indication of CMTI for the isolated differential-signal communication circuitry.

Clause 16: The system of clause 15, wherein the isolated differential-signal transmission circuitry comprising a first signal path and a second signal path; and wherein the test mode circuitry is configured to cause an input signal to be injected to both the first signal path and the second signal path.

Clause 17: The system of any of clauses 15 and 16, wherein the isolated differential-signal communication circuitry is a first isolated differential-signal communication circuitry, the circuit further comprising a second isolated differential-signal communication circuitry configured to conduct signals across the galvanic isolation barrier in a direction opposite to the signals conducted by the first isolated differential-signal communication circuitry, and wherein the test mode circuitry is configured to determine an indication of a combined CMTI for the first isolated differential-signal communication circuitry and the second isolated differential-signal communication circuitry based on an input signal injected to the first isolated differential-signal communication circuitry by the test mode circuitry.

Clause 18: The system of any of clauses 15 through 17, wherein the each of the first and second isolated differential-signal transmission circuitry comprise a receiver configured to: compare signals from the respective first signal path and the respective second signal path of the respective isolated differential-signal communication circuitry; output an indication of a difference between the signals from the respective first signal path and the respective second signal path; adjust a sensitivity of the respective receiver based on a receiver sensitivity command from the test mode circuitry.

Clause 19: A method comprising receiving, by a circuit comprising a first signal path and a second signal path, and a receiver; comparing, by the receiver, the signal from the first signal path and the second signal path; outputting, by the receiver, an indication of a difference between the first signal path and the second signal path; applying, by test mode circuitry of the circuit, a common mode test signal to both the first signal path and the second signal path at a second time different from the first time; comparing, by the receiver, the common mode test signal from the first signal path and the second signal path at the second time; determining an indication of CMTI for the isolated differential-signal transmission circuitry at the second time, based on the comparison.

Clause 20: The method of clause 19, further comprising, adjusting, by the test mode circuitry, a sensitivity of the receiver at the second time, wherein when comparing the common mode test signal from the first signal path and the second signal path at the second time, the receiver is more sensitive than at that first time.

Various examples of the disclosure have been described. These and other examples are within the scope of the following claims.

What is claimed is:
1. A circuit comprising:
a galvanic isolation barrier comprising one or more coupling components configured to conduct signals across the galvanic isolation barrier;
isolated differential-signal communication circuitry comprising the coupling components, wherein the isolated differential-signal transmission circuitry includes:
a first signal path comprising a first input terminal and a first output terminal, wherein the first signal path defines a first isolation barrier impedance; and a second signal path comprising a second input terminal and a second output terminal, wherein the second signal path defines a second isolation barrier impedance that is different than the first isolation barrier impedance, wherein the first input terminal and the second input terminal are located on a first side of the galvanic isolation barrier, and wherein the first output terminal and the second output terminal are located on a second side of the galvanic isolation barrier opposite the first side; and test mode circuitry configured to determine an indication of common mode transient immunity (CMTI) for the isolated differential-signal communication circuitry.

2. The circuit of claim 1, wherein the circuit is implemented on a single integrated circuit package.

3. The circuit of claim 1,
wherein a transformer is the galvanic isolation barrier, and
wherein the one or more coupling components further comprise a parasitic capacitor between a primary coil and a secondary coil of the transformer.

4. The circuit of claim 1, wherein the test mode circuitry is configured to cause an input signal to be injected to both the first input terminal and the second input terminal.

5. The circuit of claim 4, wherein the input signal includes one or more of: a sine wave, a rectangular wave, a burst of pulses, a triangular wave, and a stepped waveform.

6. The circuit of claim 5, the test mode circuitry further comprising test signal generation circuitry configured to generate the input signal.

7. The circuit of claim 4, wherein the test mode circuitry is configured to cause the input signal to be injected to both the first input terminal and the second input terminal based on receiving a drive mode signal.

8. The circuit of claim 4, wherein the test mode circuitry is configured to cause an input signal to be injected to both the first signal path and the second signal path at a location in the first signal path and the second signal path different from the first input terminal and the second input terminal.

9. The circuit of claim 4, wherein the isolated differential-signal transmission circuitry comprises:

a first receiver configured to output an indication of a difference between the input signals on the first signal path and the second signal path; and a second receiver configured to deliver a test output based on the difference between common mode test signals from the first signal path and the second signal path.

10. The circuit of claim 1, wherein the isolated differential-signal transmission circuitry comprises a receiver configured to:

compare signals from the first signal path and the second signal path;

output an indication of a difference between the signals from the first signal path and the second signal path; and adjust a sensitivity of the receiver based on a receiver sensitivity command from the test mode circuitry.

11. The circuit of claim 1, wherein the isolated differential-signal communication circuitry is a first isolated differential-signal communication circuitry, the circuit further comprising a second isolated differential-signal communication circuitry configured to conduct signals across the galvanic isolation barrier in a direction opposite to signals conducted by the first isolated differential-signal communication circuitry.

12. The circuit of claim 11, wherein the test mode circuitry is configured to determine an indication of a combined CMTI for the first isolated differential-signal communication circuitry and the second isolated differential-signal communication circuitry based on an input signal injected to the first isolated differential-signal communication circuitry by the test mode circuitry.

13. The circuit of claim 11, wherein the second isolated differential-signal communication circuitry conducts data indicating the CMTI of the first isolated differential-signal communication circuitry based on an input signal injected to the first isolated differential-signal communication circuitry.

14. A system comprising:
a controller including processing circuitry; and a circuit comprising:

a galvanic isolation barrier comprising one or more coupling components configured to conduct signals across the galvanic isolation barrier;

isolated differential-signal communication circuitry comprising the coupling components, wherein the isolated differential-signal transmission circuitry includes:

a first signal path comprising a first input terminal and a first output terminal, wherein the first signal path defines a first isolation barrier impedance; and a second signal path comprising a second input terminal and a second output terminal, wherein the second signal path defines a second isolation barrier impedance that is different than the first isolation barrier impedance, wherein the first input terminal and the second input terminal are located on a first side of the galvanic isolation barrier, and wherein the first output terminal and the second output terminal are located on a second side of the galvanic isolation barrier opposite the first side; and test mode circuitry configured to determine an indication of common mode transient immunity (CMTI) for the isolated differential-signal communication circuitry.

15. The system of claim 14,
wherein the isolated differential-signal transmission circuitry includes a first signal path and a second signal path; and
wherein the test mode circuitry is configured to cause an input signal to be injected to both the first signal path and the second signal path.

16. The system of claim 14,
wherein the isolated differential-signal communication circuitry is a first isolated differential-signal communication circuitry, the circuit further comprising a second isolated differential-signal communication circuitry configured to conduct signals across the galvanic isolation barrier in a direction opposite to the signals conducted by the first isolated differential-signal communication circuitry, and wherein the test mode circuitry is configured to determine an indication of a combined CMTI for the first isolated differential-signal communication circuitry and the second isolated differential-signal communication circuitry based on an input signal injected to the first isolated differential-signal communication circuitry by the test mode circuitry.

17. The system of claim 16, wherein the each of the first and second isolated differential-signal transmission circuitry comprise a receiver configured to:

compare signals from the respective first signal path and the respective second signal path of the respective isolated differential-signal communication circuitry;

output an indication of a difference between the signals from the respective first signal path and the respective second signal path; and adjust a sensitivity of the respective receiver based on a receiver sensitivity command from the test mode circuitry.

18. A method comprising:

receiving, by a circuit comprising a galvanic isolation barrier, a signal at a first time to be conducted across the galvanic isolation barrier;

conducting, by isolated differential-signal transmission circuitry of the circuit, the signal across the galvanic isolation barrier at the first time, wherein the isolated differential-signal transmission circuitry comprises:

a first signal path comprising a first input terminal and a first output terminal, wherein the first signal path defines a first isolation barrier impedance, and a second signal path comprising a second input terminal and a second output terminal, wherein the second signal path defines a second isolation barrier impedance that is different than the first isolation barrier impedance, wherein the first input terminal and the second input terminal are located on a first side of the galvanic isolation barrier, and wherein the first output terminal and the second output terminal are located on a second side of the galvanic isolation barrier opposite the first side, and a receiver;

comparing, by the receiver, the signal from the first signal path and the second signal path;

outputting, by the receiver, an indication of a difference between the first signal path and the second signal path;

applying, by test mode circuitry of the circuit, a common mode test signal to both the first signal path and the second signal path at a second time different from the first time;

comparing, by the receiver, the common mode test signal from the first signal path and the second signal path at the second time; and determining an indication of common mode transient immunity (CMTI) for the isolated differential-signal transmission circuitry at the second time, based on the comparison.

19. The method of claim 18, further comprising, adjusting, by the test mode circuitry, a sensitivity of the receiver at the second time, wherein when comparing the common mode test signal from the first signal path and the second signal path at the second time, the receiver is more sensitive than at that first time.

* * * * *